March 19, 1963 R. RICE 3,082,327

INTERCONNECTED PRINTED CIRCUIT BOARDS

Filed Dec. 8, 1960 2 Sheets-Sheet 1

INVENTOR
REX RICE
BY Elmer Galbiati
AGENT

March 19, 1963 R. RICE 3,082,327

INTERCONNECTED PRINTED CIRCUIT BOARDS

Filed Dec. 8, 1960 2 Sheets-Sheet 2

United States Patent Office 3,082,327
Patented Mar. 19, 1963

3,082,327

INTERCONNECTED PRINTED CIRCUIT BOARDS

Rex Rice, Poughkeepsie, N.Y., assignor to International Business Machines Corporation, New York, N.Y., a corporation of New York Filed Dec. 8, 1960, Ser. No. 74,528
1 Claim. (Cl. 250—220)

This invention relates to printed circuitry and, more particularly, to interconnected printed circuitry. The complexity of modern electronic devices, such as computers, necessitates a large number of circuit interconnections, hence, there is an acute need for simple, inexpensive, and reliable circuit interconnections which are easily manufactured by mass production methods.

The need for such circuit board interconnections is particularly acute in the type of system wherein components (other than mere wires or conductors) are printed on baseboards. Practical fabrication of certain printed components, such as photoresistors, make it desirable to use baseboards which can resist high temperatures and which therefore are usually somewhat brittle. These baseboards are satisfactory so long as they are small; however, they cannot be made with large surface areas, or they will tend to break when handled. Furthermore, it is found economically desirable to manufacture relatively small subassembly boards with a small number of components on each subassembly board and then to interconnect these boards. In this way, a relatively few types of basic subassembly boards can be economically manufactured in large numbers by modern mass production techniques, and then a myriad of different circuits can be assembled by interconnecting these few different types of subassembly boards with a base printed circuit board which merely has printed conductors thereon. The printed conductors which comprise the interconnections can be formed in any required pattern quite easily, whereas it is much more difficult to print the circuit components on baseboards in a large variety of patterns.

The art of interconnecting printed circuits is well developed; however, the devices shown in the prior art are generally either concerned with plug-in sockets for printed circuit boards or with providing subassemblies wherein the printed circuits are stacked one above the other to form three-dimensional module packages.

Cost, space, and reliability considerations make it desirable to eliminate the plug-in type of connections. The recourse has generally been to three-dimensional module packages which have a plurality of layers connected by vertical members. The added dimension (i.e., height) introduces structural problems which do not exist in two-dimensional packages, since it is inherently more difficult to connect parts which meet at right angles rather than parts lying in parallel planes. Generally, adding the support members necessary to make a three-dimensional module structurally adequate makes the package uneconomical or unduly bulky and cumbersome. Structural strength can be added to three-dimensional modules by potting; however, this has disadvantages, e.g., the component parts of the package are not accessible for servicing and it is difficult to provide adequate cooling.

The present invention embodies an entirely new concept of packaging. The result is essentially a two dimensional package which retains many of the advantages inherent in a three dimensional module package, but which eliminates the above mentioned structural problems inherent in three dimensional modules. The two dimensional assembly of the present invention has the full strength of a single flat baseboard, yet it has the further advantage that the various components can be manufactured on small subassembly baseboards.

The present invention utilizes a large base printed circuit board with a plurality of subassembly printed circuit boards attached thereto so that the bottom plane surface of each subassembly printed circuit board is in contact with the top surface of the base printed circuit board. The present invention is not directed to multilayer printed circuits. The present invention relates to interconnected printed circuit boards. Unlike multilayer printed circuitry wherein the various layers of circuitry are placed on a single baseboard, herein, each of the subassembly printed circuit boards has its own baseboard and these subassembly printed circuit boards are interconnected by a large base printed circuit board.

An object of the present invention is to provide a simple, inexpensive, reliable assembly of interconnected printed circuit boards.

Another object is to provide an inexpensive, reliable, essentially two dimensional array of interconnected printed circuit boards.

A further object is to provide an assembly of interconnected printed circuit boards which can be easily assembled and interconnected by mass production techniques.

A still further object is to provide interconnected printed circuit boards wherein the interconnections require a minimum of space.

Yet another object is to provide a printed circuit board wherein the active elements are distributed for maximum efficiency.

A still further object is to provide a printed circuit board with a plurality of photoreceptors arranged thereon for efficient light reception.

The concept employed in the present invention is to construct an essentially two dimensional array of interconnected printed circuit boards; that is, subassembly printed circuit boards are placed flat against a base printed circuit board. With such an assembly, a simple, reliable, inexpensive means for interconnecting the circuit boards can be realized. Confined areas of a hardened metal extending from the circuitry on the subassembly printed circuit boards to the circuitry on the base printed circuit board provide the desired interconnections.

An improved structure is achieved by beveling the edge of the subassembly boards so that there is a slanted plane between the circuitry on the subassembly boards and the circuitry on the base printed circuit board; therefore, the hardened metal does not have to coat any sharp corners.

The foregoing and other objects, features and advantages of the invention will be apparent from the following more particular description of a preferred embodiment of the invention as illustrated in the accompanying drawings.

In general, the preferred embodiment shown herein (FIG. 1) consists of a large number of subassembly printed circuit boards 12 (only two being shown for convenience of illustration) which are mounted on, and electrically connected to the base printed circuit board 14.

Figure 2:
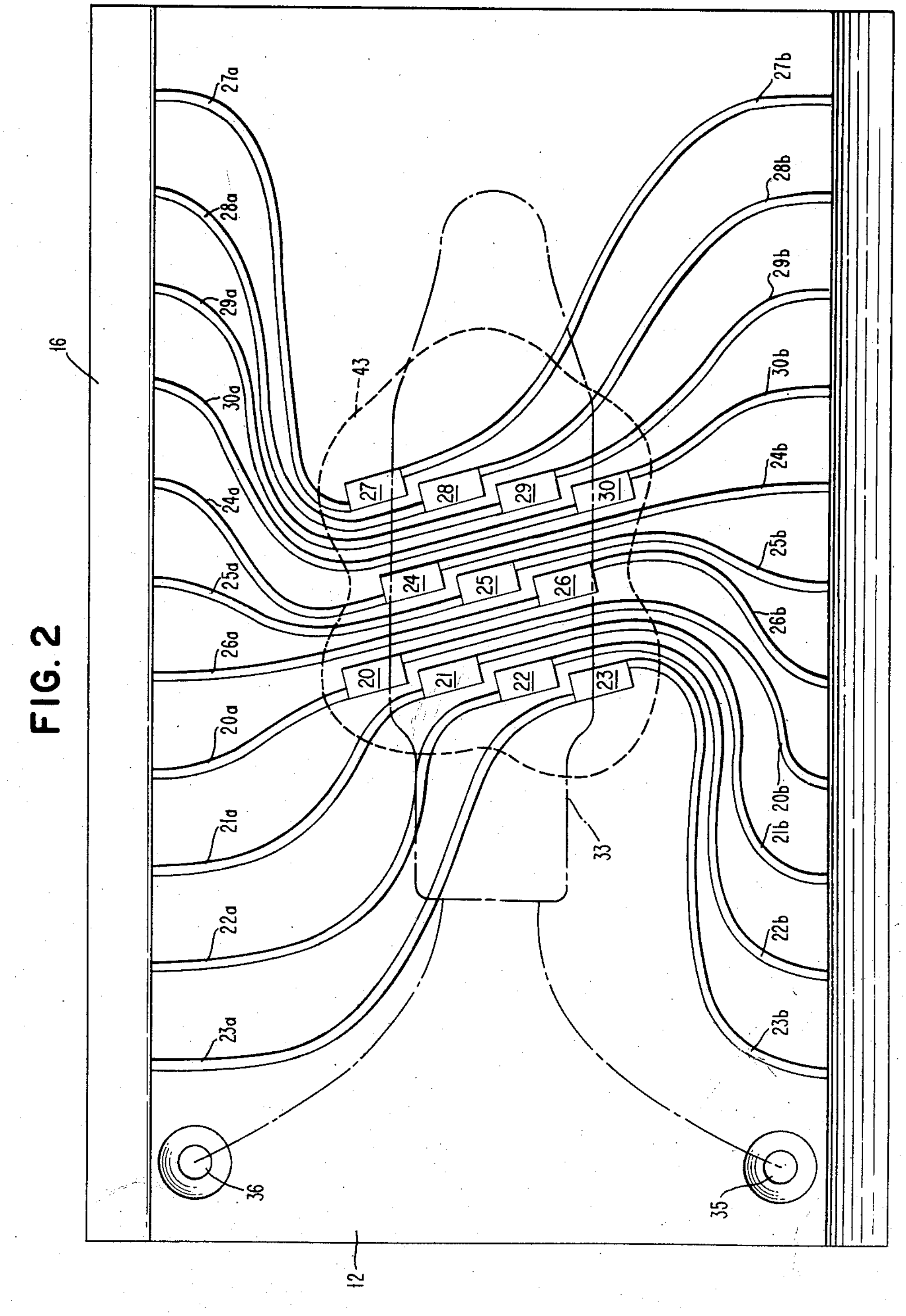
FIG. 2 is an enlarged view of a portion of one subassembly printed circuit board.

Each of the subassembly printed circuit boards 12, hereinafter called substrates, has a plurality of circuit components 20 to 30 (FIG. 2) mounted thereon and connected to the printed conductors 20*a*, 20*b*, 21*a*, . . . 30*a* and 30*b*. The printed conductors 20*a*, 20*b*, 21*a*, . . .

30*a* and 30*b* extend to the edges 16 and 17 of the substrates. The base printed circuit board 14 has printed conductors 32 on its surface, which extend to the edges 16 and 17 of the substrates. Confined areas of hardened sprayed metal 34 extend from conductors 32 on baseboard 14 over beveled edges 16 and 17 to the conductors 20*a*, 20*b*, 21*a* . . . 30*a* and 30*b* on the subassembly boards 12, establishing electrical interconnections therebetween.

In these specifications and in the appended claims the term circuit component will be used to designate electrical elements other than mere conductors or wires. In the exemplary embodiment shown herein the specific components shown are photoresistors. The term component is defined this way so that a differentiation can be made between printed conductors which can be easily printed on inexpensive low temperature semiflexible base material and the circuit elements (i.e., the components) which require a more expensive, high temperature, hardened base material.

The base material for the substrates 12 may be porcelain, glass, or any other high temperature material which is particularly well suited for having the various components printed on the its surface. Such materials are generally brittle and they are unsuited as base materials for large boards; however, since the area of each individual substrate is small, it is not necessary for the substrates to be particularly strong or flexible. The strength for the entire assembly is provided by baseboard 14, which is constructed from a strong semiflexible resinous material, for example, such materials as "Textolite," manufactured by the General Electric Company, or Formica EP-37, manufactured by the Formica Corporation, have been found to be suitable. Since baseboard 14 only has conductors printed thereon, and since conductors can be printed much more easily than components, the choice of material for the baseboard can be more closely dictated by the structural requirements of strength and flexibility, rather than by requirements such as the high temperature tolerance which is required for a suitable base material for the circuit components.

In the particular embodiment shown herein, areas of metal 34, which connect conductors 20*a*, 20*b*, etc. on subassembly boards 12 with conductors 32 on baseboard 14 consist of hardened sprayed metal. The metal is applied by the well known metal spray technique which is particularly well suited to mass porduction methods. A mask with holes appropriately punched therein can be indexed over the substrates, then by spraying through the mask, all of the desired connections can be made. If the mask is properly indexed, there is no danger that the wrong wires will be connected through human error. Copper has been found to form a good electrical connection and a firm mechanical bond when sprayed; however, other metals can also be used.

Figures 1, 3, 4:
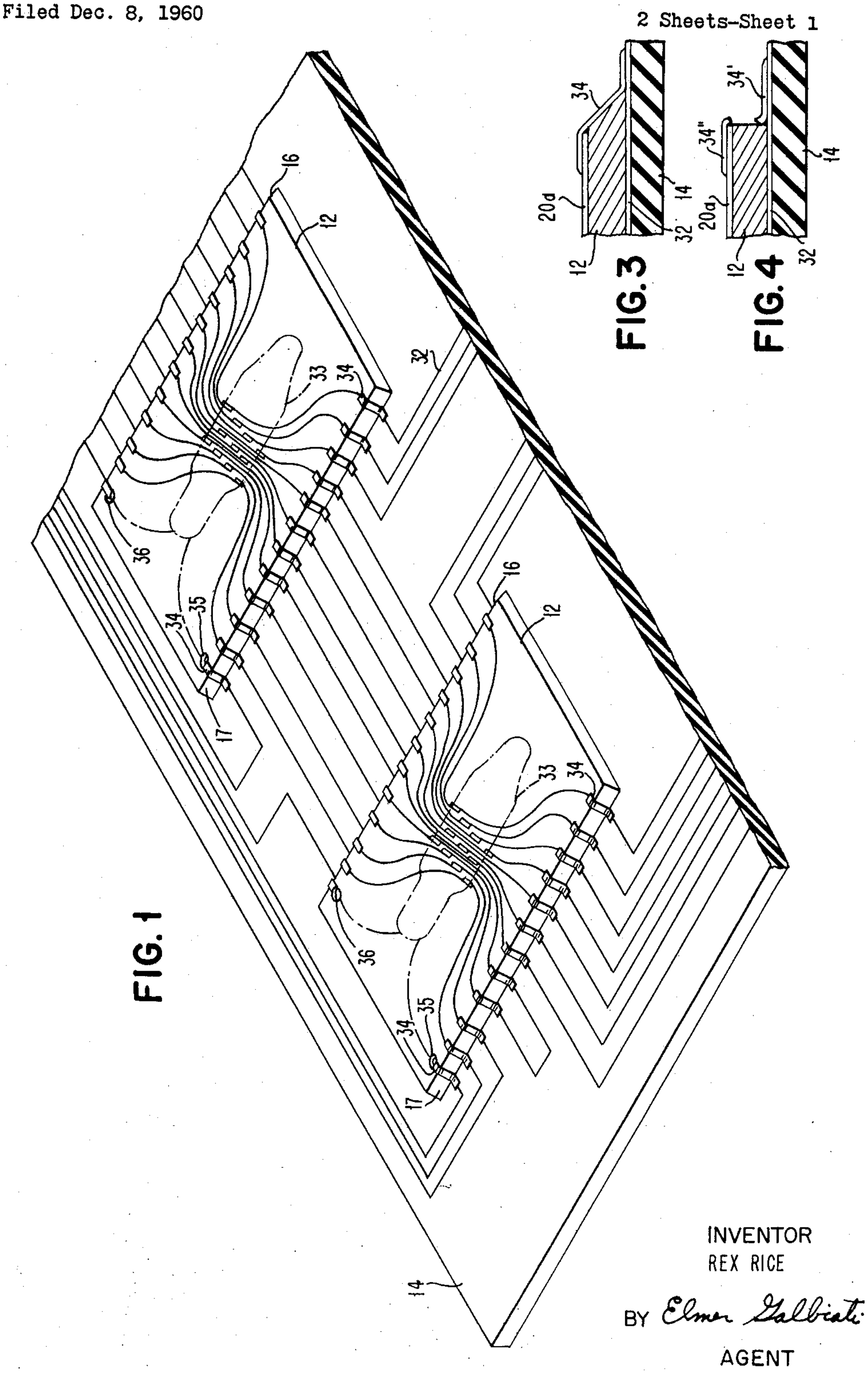
FIG. 1 is a perspective view of a portion only of a large base printed circuit board with a plurality of subassembly printed circuit boards attached thereto showing a preferred embodiment of the invention.
FIG. 3 is an enlarged cross-section view of a satisfactory connection between a substrate and the baseboard in accordance with one feature of the invention.
FIG. 4 is a view similar to FIG. 3 of an unsatisfactory connection between a substrate and the baseboard illustrating the desirability of the feature shown in FIG. 3.

Edges 16 and 17 of substrates 12 are beveled, hence, the confined areas of metal 34 which connect circuits 20*a*, 20*b*, etc. on the substrate with circuitry 32 on baseboard 14 do not coat any sharp corners (see FIG. 3). The result is a strong bond, which not only provides an electrical connection between the circuits 20*a*, 20*b*, etc., and the circuitry 32, but the areas of metal 34 also provide a mechanical bond between the substrates 12 and the baseboard 14.

Since the holes in the mask must be relatively small so that metal areas 34 only connect the desired conductors together, the metal must necessarily be sprayed onto the boards from a direction perpendicular to the surfaces of the boards. If substrates 12 had vertical edges, conditions such as that shown in FIG. 4 would occur. That is, it would be difficult to coat the vertical edge of the substrates. The mechanical bond formed by the areas of metal 34 is sufficient to hold the substrate 12 to the baseboard 14; however, for added strength, substrates 12 are preferably also cemented to baseboard 14 with any suitable adhesive such as rubber cement.

In the particular embodiment shown herein, the circuit components 20–30 are photoresistors, i.e., resistors whose resistance changes with changes in the incident light. It is contemplated that a neon bulb will be mounted above each substrate (the outline of the neon bulb is shown by the dot-dash line 33) and terminals 35 and 36 are provided for connecting the lead wires of the neon bulb.

The pattern of photoresistors 20 to 30 is laid out so as to take maximum advantage of the light from the neon bulb. It has been discovered that a small neon lamp such as a General Electric Company model NE-2 produces a pattern of light which may be described as having an "hour-glass" shape, that is, it is wider at its ends than it is in the center. The light pattern from the neon bulb is shown by the dotted line 43 in FIG. 2. Hence, the pattern of photoresistors is laid out to fall within the hour-glass pattern in rows which are substantially perpendicular to the axis of the neon bulb, the end rows being longer than the center rows.

It should be understood that the term "printed circuitry" is used herein broadly to include any of the methods known in the art for depositing a pattern of conductive areas on a baseboard, such as metal spraying, photographic electrodeposition, vacuum metalizing, or silk screen processes.

While the invention has been particularly shown and described with reference to a preferred embodiment thereof, it will be understood by those skilled in the art that the foregoing and other changes in form and detail may be made therein without departing from the spirit and scope of the invention.

I claim:

In combination a large baseboard of insulating material, a plurality of substrates of insulating material lying flat on said baseboard, a neon lamp positioned adjacent to each substrate and arranged to illuminate the top surface thereof, a plurality of photoconductors in thin film form on the top surface of said substrate, said photoconductors being arranged in a pattern having an hourglass shape, the neon lamp being positioned with its axis parallel to the axis of the hour-glass pattern of photoconductors, printed conductors on said substrates connecting with said components and extending to the edges of said substrates, printed conductors on said baseboard extending to the edges of said substrates, a plurality of connections between said conductors on said baseboard and said conductors on said substrates, each of said connections comprising a localized coating of hardened, sprayed metal extending from said circuitry on said substrate to said circuitry on said baseboard.

References Cited in the file of this patent

UNITED STATES PATENTS

| | | |
|---|---|---|
| 1,853,443 | Maul | Apr. 12, 1932 |
| 2,611,040 | Brunetti | Sept. 16, 1952 |
| 2,769,119 | Martin et al. | Oct. 30, 1956 |
| 2,870,400 | Hickok | Jan. 20, 1959 |
| 2,871,428 | Shen | Jan. 27, 1959 |
| 2,910,628 | Keener | Oct. 27, 1959 |
| 2,999,942 | Klasens et al. | Sept. 12, 1961 |